United States Patent
Chen et al.

(10) Patent No.: US 9,312,243 B2
(45) Date of Patent: Apr. 12, 2016

(54) SEMICONDUCTOR PACKAGES

(71) Applicant: Taiwan Semiconductor Manufacturing Company, Ltd., Hsin-Chu (TW)

(72) Inventors: Meng-Tse Chen, Changzhi Township (TW); Yi-Da Tsai, Dongshi Township (TW); Xi-Hong Chen, Luzhu Township (TW); Tao-Hua Lee, Taipei (TW); Wei-Yu Chen, Taipei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/497,721

(22) Filed: Sep. 26, 2014

(65) Prior Publication Data

US 2015/0008594 A1    Jan. 8, 2015

Related U.S. Application Data

(62) Division of application No. 13/604,333, filed on Sep. 5, 2012, now Pat. No. 8,889,486.

(51) Int. Cl.
*H01L 23/52* (2006.01)
*H01L 25/065* (2006.01)
(Continued)

(52) U.S. Cl.
CPC ........ *H01L 25/0657* (2013.01); *H01L 23/3128* (2013.01); *H01L 23/3135* (2013.01); *H01L 23/49816* (2013.01); *H01L 23/5384* (2013.01); *H01L 25/105* (2013.01); *H01L 21/563* (2013.01); *H01L 23/5385* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 25/50* (2013.01); *H01L 2224/13116* (2013.01);
(Continued)

(58) Field of Classification Search
CPC ............ H01L 25/0657; H01L 23/3135; H01L 2225/0651; H01L 2225/0652
USPC ........................................................ 257/777
See application file for complete search history.

(56) References Cited

U.S. PATENT DOCUMENTS 6,510,976 B2 * 1/2003 Hwee et al. ............... 228/180.22
6,560,122 B2   5/2003 Weber
(Continued)

OTHER PUBLICATIONS

Dr. Andy Mackie, "Semiconductor/Power Semiconductor Assembly; Epoxy Flux Dipping for CSP and PoP Applications," From One Engineer to Another, Pub. Jan. 14, 2011, Retrieved Jul. 18, 2012, 3 pages, http://blogs.indium.com/blog/semiconductor-and-power-semi-assembly/epoxy-flux-dippin . . . >.

*Primary Examiner* — Luan C Thai
(74) *Attorney, Agent, or Firm* — Slater & Matsil, L.L.P.

(57) ABSTRACT

A semiconductor package may include a first substrate, a second substrate facing the first substrate, a plurality of first electrical connections disposed between the first substrate and the second substrate, and a first material disposed between the first substrate and the second substrate. The plurality of first electrical connections may electrically couple the first substrate and the second substrate to each other. The first material may surround each of the plurality of first electrical connections, and a width of the first material proximal the first substrate may be smaller than a width of the first material proximal the second substrate.

20 Claims, 5 Drawing Sheets

(51) Int. Cl.
  H01L 23/31    (2006.01)
  H01L 25/10    (2006.01)
  H01L 23/498   (2006.01)
  *H01L 21/56*      (2006.01)
  *H01L 23/538*     (2006.01)
  *H01L 23/00*      (2006.01)
  *H01L 25/00*      (2006.01)

(52) U.S. Cl.
  CPC .......... *H01L2224/13124* (2013.01); *H01L 2224/13144* (2013.01); *H01L 2224/13147* (2013.01); *H01L 2224/16225* (2013.01); *H01L 2224/291* (2013.01); *H01L 2224/29116* (2013.01); *H01L 2224/32145* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48229* (2013.01); *H01L 2224/73265* (2013.01); *H01L 2224/81805* (2013.01); *H01L 2225/0651* (2013.01); *H01L 2225/0652* (2013.01); *H01L 2225/06565* (2013.01); *H01L 2225/1023* (2013.01); *H01L 2225/1058* (2013.01); *H01L 2924/01322* (2013.01); *H01L 2924/12042* (2013.01); *H01L 2924/15311* (2013.01); *H01L 2924/15331* (2013.01)

(56) References Cited

U.S. PATENT DOCUMENTS

| | | | |
|---|---|---|---|
| 8,035,235 | B2 | 10/2011 | Jang et al. |
| 8,508,954 | B2 | 8/2013 | Kwon et al. |
| 8,524,595 | B2 * | 9/2013 | Lii et al. .......... 438/613 |
| 2003/0099767 | A1 * | 5/2003 | Fang .............. 427/96 |
| 2007/0290376 | A1 | 12/2007 | Zhao et al. |
| 2008/0138934 | A1 | 6/2008 | Kim et al. |
| 2009/0258460 | A1 * | 10/2009 | Oi et al. .......... 438/108 |
| 2012/0104595 | A1 * | 5/2012 | Haba et al. ........ 257/737 |
| 2012/0306075 | A1 | 12/2012 | Kim et al. |

* cited by examiner

SEMICONDUCTOR PACKAGES

This application is a divisional of U.S. patent application Ser. No. 13/604,333, entitled "Methods and Apparatus for Package on Package Structures," filed on Sep. 5, 2012, which application is hereby incorporated herein by reference.

BACKGROUND

Improvements in the size, formation, density, and packaging of integrated circuits ("ICs") have led the semiconductor industry to experience rapid growth. Improvements in integration density have led to decreased IC feature size, which allows more components to be integrated into a given area.

These integration improvements are essentially two-dimensional ("2D") in nature, in that the volume occupied by the integrated components is essentially on the surface of a semiconductor wafer. Although dramatic improvement in lithography has resulted in considerable improvement in 2D IC formations, there are physical limits to density that can be achieved in two dimensions. One of these limits is the minimum size needed to make these components. Another is the increased design complexity for increased density 2D IC formations.

One attempt to increase circuit density is to stack two IC dies on top of each other to form what is referred to as a three-dimensional ("3D") IC. In a typical 3D IC formation process, two dies are bonded together and electrical connections are formed between each die and contact pads on a substrate. For example, two dies may be bonded on top of each other with the lower die being coupled to a substrate.

Another 3D package which increases circuit density is referred to as a "Package-on-Package" ("PoP") structure, wherein multiple dies coupled to respective substrates (e.g., an interposer) can be "stacked" on top of each other and coupled together. To form a PoP structure, a first die is electrically coupled to a first substrate to form a first circuit. The first circuit includes first connection points for connecting to a second circuit. The second circuit includes a second die and substrate having connection points on each side of the substrate. The first circuit is stacked and electrically coupled on top of the second circuit to form the PoP structure. The PoP structure can then be electrically coupled to a printed circuit board ("PCB") or the like.

In this manner, PoP structures provide increased feature density for ICs which enables more functionality to be integrated into an IC package within a minimized surface area or "footprint" on a PCB.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1:
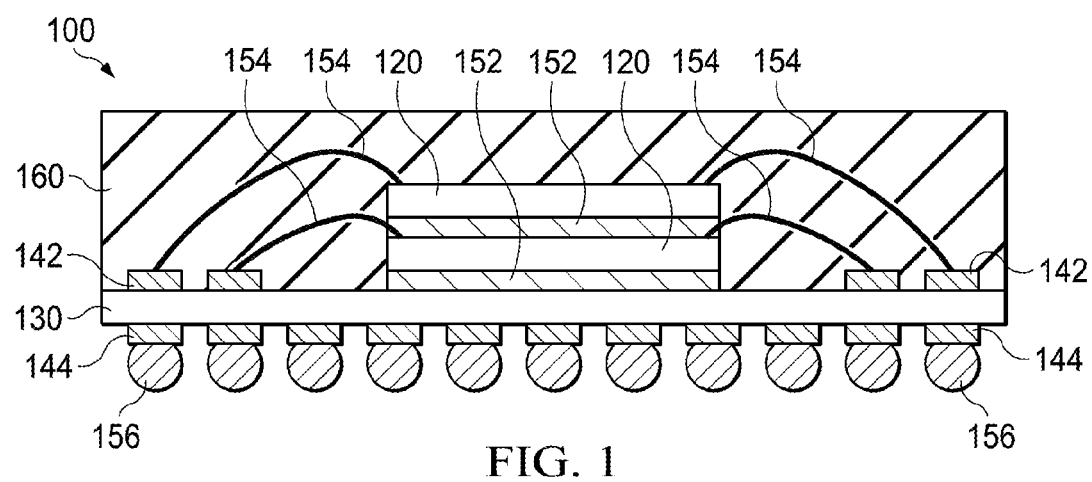
FIGS. 1-4 illustrate various intermediate stages of forming an embodiment.

Referring first to FIG. 1, there is illustrated a cross-section view of a first substrate 130 in accordance with an embodiment. In an embodiment, the first substrate 130 may be a component of a package 100, which may include, for example, one or more integrated circuit die(s) 120 mounted on the first substrate 130 via a first set of conductive connections 152. The first set of conductive connections 152 may comprise, for example, lead free solder, eutectic lead, conductive pillars, combinations thereof, and/or the like.

In an embodiment, the integrated circuit die(s) 120 may also be connected to the first substrate 130 via a second set of conductive connections 154 coupled to each of a first set of conductive features 142. The second set of conductive connections 154 may comprise, for example, capillary wire bonds, which may be formed of aluminum, copper, gold, or other wire bonding materials. The first set of conductive features 142 may be formed of aluminum, copper, gold or other like materials. In an embodiment, the second set of conductive connections 154 may, for example, be coupled to the first set of conductive features 142 using a thermocompression bond ("TCB"). FIG. 1 illustrates electrical connections formed between the integrated circuit dies 120 (the second set of conductive connections 154) using wire bonding techniques for illustrative purposes only. Other embodiments may utilize other methods, such as flip-chip, ball grid arrays, through vias, and the like.

In various embodiments, the first substrate 130 may be, for example, a packaging substrate, a printed-circuit board, a high-density interconnect, or the like. Through vias ("TVs") (not shown) may be used to provide electrical connections between each of the first integrated circuit die(s) 120 and each of a second set of conductive features 144 on an opposing surface of the first substrate 130. The first substrate 130 may also include redistribution lines ("RDLs") (not shown) within and/or on one or both surfaces of the first substrate 130 to allow for a different pin configuration as well as larger electrical connections. A first encapsulant or overmold 160 may also be formed over the components to protect the components from the environment and/or external contaminants. In various embodiments, the first encapsulant may include an epoxy, a $SiO_2$ filler, a hardener, an adhesion promoter, a catalyst, combinations thereof and the like.

In an embodiment, the second set of conductive features 144 may have formed thereon a third set of conductive connections 156 in electrical contact with the second set of conductive features 144. The third set of conductive connections 156 may comprise, for example, lead free solder, eutectic lead, conductive pillars, combinations thereof, and/or the like. In another embodiment, a flux (not shown) may be applied to the surface of each of the second set of conductive features 144, which may be in contact with each of the corresponding third set of conductive connections 156. The flux may be applied, for example, during an operation in which the surface of the first substrate 130 may be dipped or coated in the flux. The flux may help clean the surface of the second set of conductive features 144 thereby aiding in the formation of the electrical contact between each of the second set of conductive features 144 and each of the corresponding the third set of conductive connections 156.

Figure 2A:
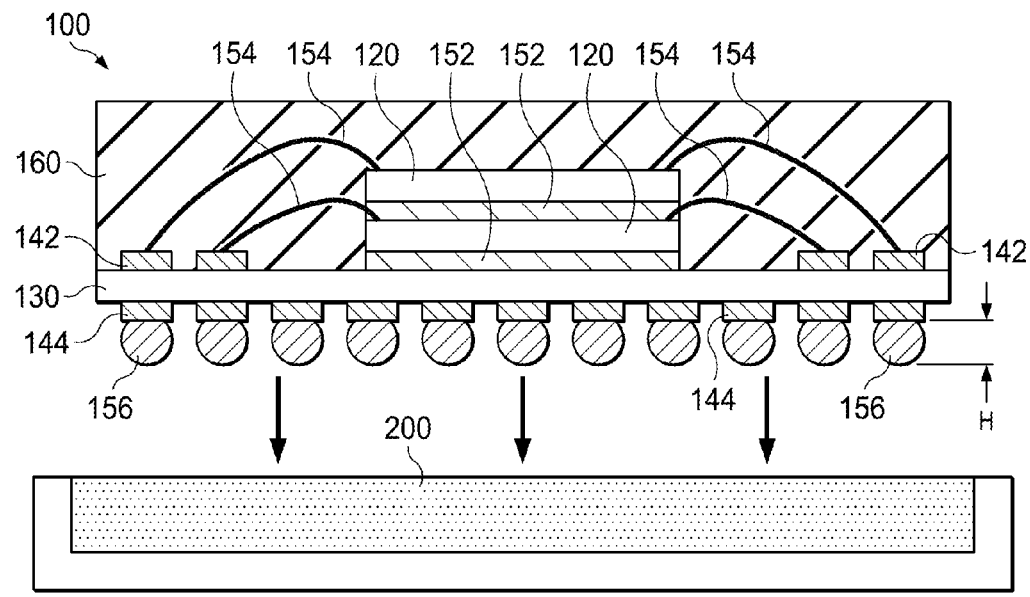

Referring now to FIG. 2(A), an epoxy flux 200 may be applied to the third set of conductive connections 156. In various embodiments, the epoxy flux 200 may comprise, for example, a polymer, epoxy, flux, and/or the like or any combination thereof. Exemplary epoxy fluxes that may be used with embodiments of the present disclosure are manufactured by Henkel® or the Indium Corporation®.

In an embodiment, as illustrated in FIG. 2(A), the first package 100 may be dipped in the epoxy flux 200 to cover an exposed surface of the third set of conductive connections 156. As shown in FIG. 2(A), the third set of conductive connections 156 may have a full height H as measured from a surface of the second set of conductive features 144. In an embodiment, the epoxy flux 200 may be applied to the surface of each of the third set of conductive connections 156 to between about one-half and less than the full height H of each of the third set of conductive connections 156.

Although FIG. 2(A) illustrates dipping the package 100 in the epoxy flux 200, the epoxy flux 200 may be applied to the third set of conductive connections 156 through other methods, such as, for example, spraying or brushing the epoxy flux 200 on the third set of conductive connections 156 to between about one-half and less than the full height H of each of the third set of conductive connections. In an embodiment, the epoxy flux 200 may be applied, in an individual manner to each of the third set of conductive connections 156 through an injection or other similar means to apply the epoxy flux 200 to the surface of the third set of conductive connections 156.

Figure 2B:
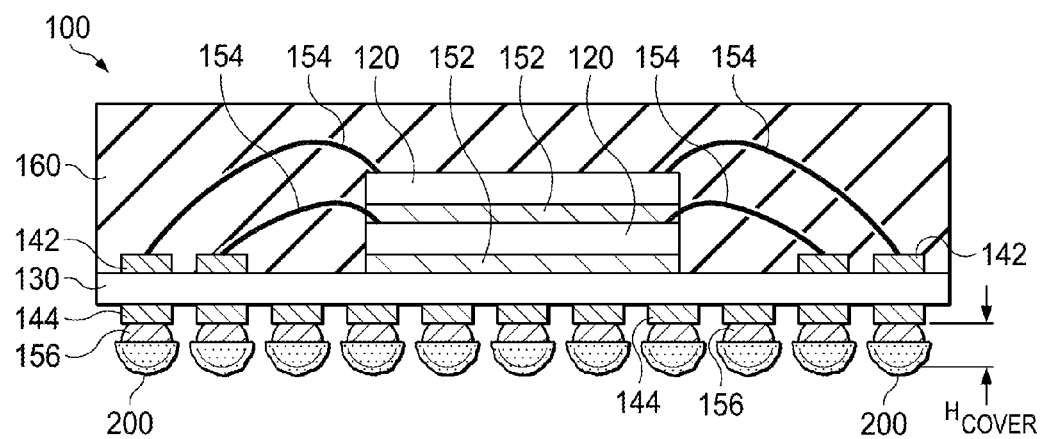

FIG. 2(B) illustrates the epoxy flux 200 as applied to the surface of each of the third set of conductive connections 156 following a desired application method, as discussed above. As illustrated, the epoxy flux 200 may be applied to the surface of the third set of conductive connections 156 to between about one-half and less than the full height H of each of the third set of conductive connections to a cover height $H_{COVER}$. Applying the epoxy flux 200 to the cover $H_{COVER}$ within the range of between about one-half and less than the full height H of each of the third set of conductive connections 156 may prevent bridging between the third set of conductive connections 156 during subsequent reflow of the connections, which is described in further detail below. Application of the epoxy flux 200 to the third set of conductive connections 156 outside this range may not prevent bridging during reflow.

Figure 3:
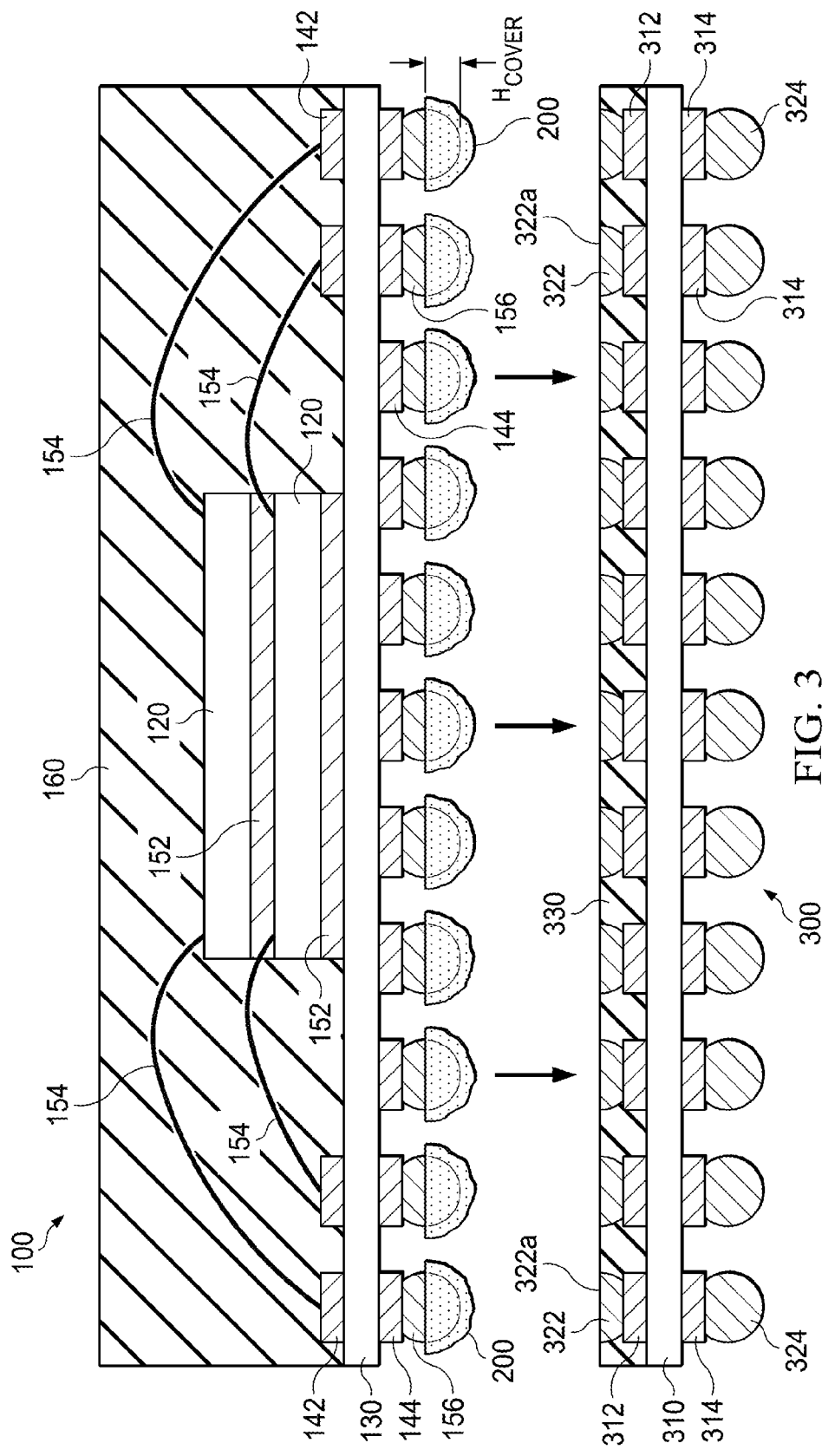

Referring now to FIG. 3, the package 100 may be electrically coupled to a second substrate 310. In an embodiment, the second substrate 310 may be a component of a package 300, which may include, for example, one or more IC die(s) (not shown) mounted thereon. The one or more IC die(s) may be mounted on the second substrate 310 using conductive connections (not shown) which may comprise, for example, lead free solder, eutectic lead, conductive pillars, capillary wire bonds, combinations thereof, and/or the like. The conductive connections may be coupled to conductive features (also not shown), which may provide electrical contact between the one or more IC dies and the second substrate 310. The conductive connections and features may be formed of aluminum, copper, gold, combinations thereof, or the like.

Further formed on the surfaces of the second substrate 310 may be a third set of conductive features 312, which may be formed on the same side as the one or more IC die(s), and a fourth set of conductive features 314, which may be formed on an opposing surface of the second substrate 310. In an embodiment, the third set of conductive features 312 may have formed thereon a fourth set of conductive connections 322, which may comprise lead free solder, eutectic lead, conductive pillars, combinations thereof, and/or the like. In an embodiment, the fourth set of conductive features 314 may have formed thereon a fifth set of conductive connections 324, which may comprise lead free solder, eutectic lead, conductive pillars, combinations thereof, and/or the like.

In various embodiments, the second substrate 310 may be, for example, a packaging substrate, a printed-circuit board, a high-density interconnect, or the like. Through vias (not shown) may be used to provide electrical connections between the IC die(s) and the fourth set of conductive features 314 on the opposing surface of the second substrate 310. The second substrate 310 may also include RDLs (not shown) within and/or on one or both surfaces of the second substrate 310 to allow for a different pin configuration as well as larger electrical connections. A second encapsulant or overmold 330 may also be formed over the components to protect the components from the environment and external contaminants.

During manufacture, the second encapsulant 330 may first be applied to fully cover (not shown) the fourth set of conductive connections 322. The second encapsulant 330 may then be removed to expose a surface 322a of each of the fourth set of conductive connections 322. Removal of the second encapsulant 330 may be performed using a saw, laser, grinding, or other similar singulation process to expose the surface 322a of each of the fourth set of conductive connections 322. Following removal of the second encapsulant 330, the surfaces 322a of each of the fourth set of conductive connections 322 may be at an approximately equal height along a horizontal plane parallel to the surface of the second substrate 310.

Figure 4:
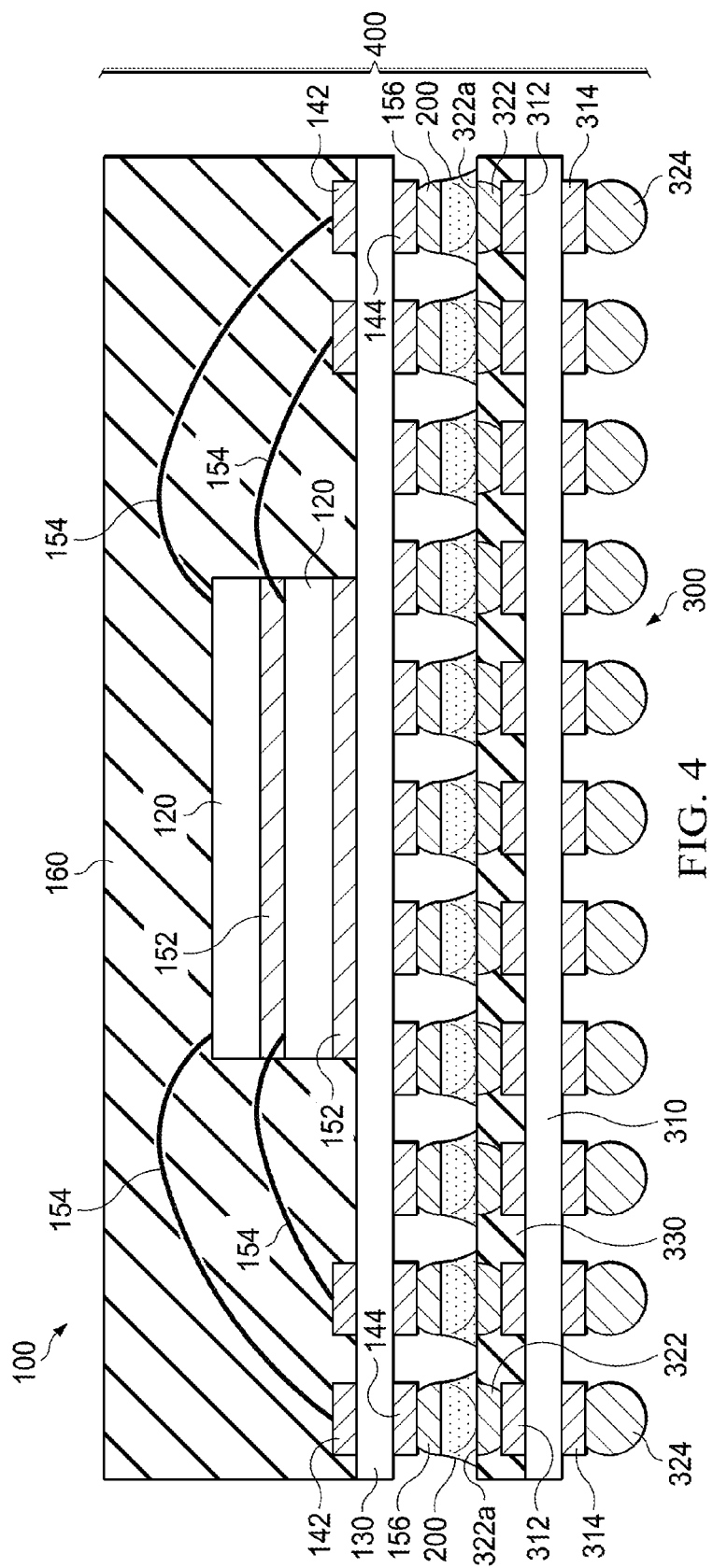

The first substrate 130 may be electrically coupled to the second substrate 310, thereby creating a Package-on-Package structure 400, as illustrated in FIG. 4. FIG. 4 illustrates a bonding step in accordance with an embodiment wherein the third set of conductive connections 156 (having the epoxy flux 200 applied to the surface of each connection) may be brought into contact with the fourth set of conductive connections 322 of the second substrate 310. Each of the corresponding third and fourth conductive connections 156, 322 of the first and second substrates 130, 310 may be bonded using a reflow process. In various embodiments, the reflow process may include induction reflow, RTP, IR, and the like.

Given that the surfaces 322a of each of the fourth set of conductive connections 322 of the second substrate 310 may be at an approximately equal height following removal of the second encapsulant 330, the epoxy flux 200 may inhibit or prohibit electrical bridging or shorting between the conductive connections of the substrates 130, 310 during reflow. Such electrical bridging or shorting may otherwise occur in the absence of the epoxy flux 200 being applied to the third set of conductive connections 156 to the cover height $H_{COVER}$. Further, electrical bridging or shorting may occur if the coverage of the epoxy flux 200 is outside the range of between about one-half and less than the full height H of each of the third set of conductive connections 156.

In an embodiment, the second set of conductive features 144 on the first substrate 130 and the third and fourth sets of conductive features 312, 314 on the second substrate 310 may be arranged in a ball grid array ("BGA") arrangement. In various embodiments, the pitch of third and fourth sets of conductive features may vary in a range from approximately 200 μm to approximately 500 μm.

Figure 5:
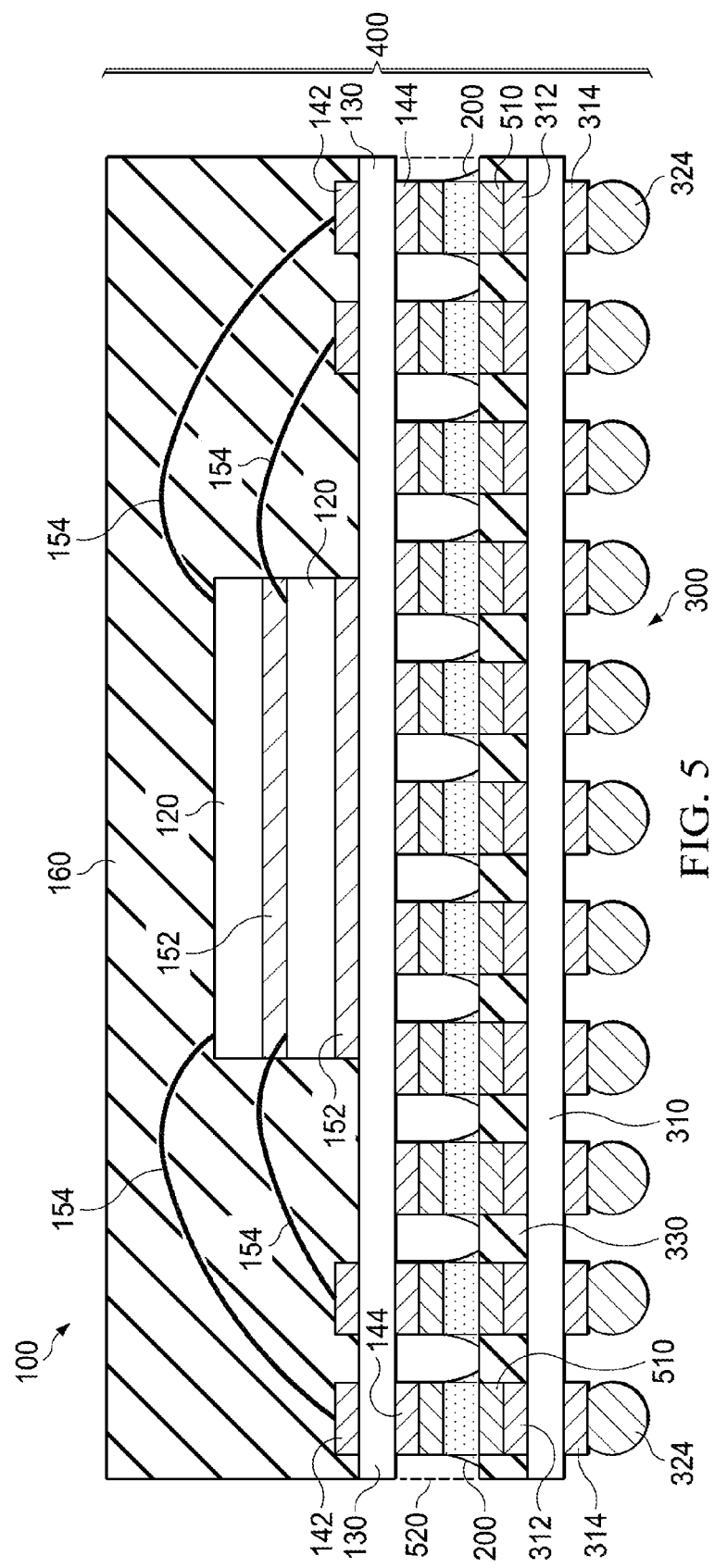
FIG. 5 illustrates a cross sectional view of a semiconductor formed according to an embodiment.

FIG. 5 illustrates a combined fifth set of conductive connections 510 formed between the second and third conductive features 144, 312 of the corresponding first and second substrates 130, 310 following the reflow of third and fourth conductive connections 156, 322 of FIG. 4. Following reflow of a material which may include, for example, an epoxy flux mixture, the flux may evaporate, which may leave epoxy 520 formed between the fifth set conductive connections 510. In an embodiment, wherein a polymer and flux may be used, there may be left polymer formed between the fifth set of conductive connections 510.

It should be noted that the shape of the fifth set of conductive connections 510 as illustrated in FIG. 5 is arbitrary and may change depending on various factors including, but not limited to, distance between the first and second substrates 130, 310, the time period that the reflow may be performed, the type of reflow process, and/or the types/material composition of third and fourth conductive connections 156, 322 formed on the second and third conductive features 144, 312 of the first and second substrates 130, 310.

Following reflow of the third and fourth conductive connections 156, 322 of the corresponding first and second substrates 130, 310 to form the fifth set of conductive connections 510, other normal processes may be used to complete the package 400. In an illustrative example, the second substrate 310 may be electrically coupled to yet another substrate, such as a PCB, a high density interconnect, a silicon substrate, an organic substrate, a ceramic substrate, a dielectric substrate, a laminate substrate, another semiconductor package, or the like. Further, a third encapsulant or overmold 520 may be formed between the first substrate 130 and the second encapsulant 330 to protect the substrate from the environment and external contaminants.

In an embodiment a device is provided. The device comprises a first substrate having a first surface, a second substrate having a first surface covered by a first encapsulant, a plurality of first electrical connections electrically coupling the first substrate to the second substrate, and a first material positioned between each of the first electrical connections, wherein the material is separated from the first surface of the first substrate.

In another embodiment, a method is provided. The method comprises providing a first substrate having a first plurality of electrical connections formed thereon; applying a first material to the first plurality of electrical connections to between about one-half and less than a full height of each of the first plurality of electrical connections; providing a second substrate having a second plurality of electrical connections formed thereon; contacting the first plurality of electrical connections of the first substrate to the second plurality of electrical connections of the second substrate; and performing a reflow process to form a third plurality of electrical connections between the first substrate and the second substrate, wherein the first material is positioned between each of the third plurality of electrical connections.

In another embodiment, another method is provided. The method comprises providing a first substrate; forming a first plurality of electrical connections on a first plurality of electrical features of the first substrate; applying a first material to the first plurality of electrical connections to between about one-half and less than a full height of each of the first plurality of electrical connections; providing a second substrate; forming a second plurality of electrical connections on a second plurality of electrical features of the second substrate; covering the second plurality of electrical connections with a first encapsulant; removing the first encapsulant from a surface of each of the second plurality of electrical connections; contacting the first plurality of electrical connections of the first substrate to the second plurality of electrical connections of the second substrate; and performing a reflow process to form a third plurality of electrical connections between the first substrate and the second substrate, wherein the first material is positioned between each of the third plurality of electrical connections.

It should be understood that the above description provides a general description of embodiments and that embodiments may include numerous other features. For example, embodiments may include under bump metallization layers, passivation layers, molding compounds, additional dies and/or substrates, and the like. Additionally, the structure, placement, and positioning of the first IC die(s) 120 are provided for illustrative purposes only, and accordingly, other embodiments may utilize different structures, placements, and positions.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package comprising:
   a first substrate having a first side and a second side opposite the first side, the first substrate comprising:
      a first encapsulant formed over the first side of the first substrate; and
      a first plurality of electrical features formed at the second side of the first substrate;
   a second substrate having a first side and a second side opposite the first side, the second substrate comprising a second plurality of electrical features formed on the first side of the second substrate;
   a plurality of first electrical connections coupled between the first plurality of electrical features and the second plurality of electrical features;
   a second encapsulant disposed over the first side of the second substrate, the second encapsulant positioned between each of the plurality of first electrical connections; and
   a first material disposed over the second encapsulant, the first material positioned between each of the plurality of first electrical connections, wherein the first material is separated from the second side of the first substrate.

2. The semiconductor package of claim 1, further comprising:
   a third encapsulant disposed between the second encapsulant and the second side of the first substrate.

3. The semiconductor package of claim 2, wherein the third encapsulant comprises a molding underfill.

4. The semiconductor package of claim 1, wherein the first material comprises a material selected from the group consisting of epoxy, polymer, flux, and any combination thereof.

5. The semiconductor package of claim 1, wherein a pitch of the plurality of first electrical connections is within a range from approximately 200 μm to approximately 500 μm.

6. The semiconductor package of claim 1, wherein the plurality of first electrical connections are formed on at least one perimeter of the first substrate.

7. The semiconductor package of claim 1, wherein the first material encapsulates a portion of each of the plurality of first electrical connections.

8. The semiconductor package of claim 7, wherein a widest lateral extent of the first material is greater than a widest lateral extent of each of the plurality of first electrical connections.

9. A semiconductor package comprising:
a die package comprising:
a first substrate;
at least one die disposed over a first surface of the first substrate; and
a first plurality of conductive features formed at a second surface of the first substrate opposite the first surface;
a second substrate having a second plurality of conductive features formed over a surface of the second substrate facing the first substrate;
a plurality of first electrical connections disposed between the first plurality of conductive features and the second plurality of conductive features;
an encapsulant disposed over the surface of the second substrate facing the first substrate, the encapsulant encapsulating the second plurality of conductive features; and
a first material disposed over the encapsulant, the first material surrounding each of the plurality of first electrical connections.

10. The semiconductor package of claim 9, wherein a surface of the first material facing the first substrate is spaced apart from the first plurality of conductive features.

11. The semiconductor package of claim 9, wherein the die package further comprises a second encapsulant disposed over the first surface of the first substrate, the second encapsulant encapsulating the at least one die.

12. The semiconductor package of claim 9, wherein a width of the die package is substantially equal to a width of the second substrate.

13. The semiconductor package of claim 9, wherein the encapsulant further encapsulates a portion of the plurality of first electrical connections proximal the second plurality of conductive features.

14. The semiconductor package of claim 9, wherein the first material comprises a material selected from the group consisting of epoxy, polymer, flux, and any combination thereof.

15. The semiconductor package of claim 9, further comprising:
a third substrate electrically coupled to the second substrate, the third substrate disposed at a side of the second substrate facing away from the first substrate.

16. The semiconductor package of claim 15, wherein the third substrate comprises at least one of a printed circuit board, a high density interconnect, a silicon substrate, an organic substrate, a ceramic substrate, a dielectric substrate, or a laminate substrate.

17. A semiconductor package comprising:
a first substrate having a first plurality of electrical features extending from a surface thereof;
a second substrate substrate having a second plurality of electrical features extending from a surface thereof, wherein the first plurality of electrical features is directed toward the second plurality of electrical features;
a plurality of first electrical connections disposed between the first plurality of electrical features and the second plurality of electrical features;
an encapsulant encapsulating the second plurality of electrical features and a first portion of each of the plurality of first electrical connections proximal the second substrate;
a first material, comprising an electrically non-conductive material, disposed between the first substrate and the second substrate, the first material surrounding a second portion of each of the plurality of first electrical connections proximal the first substrate, wherein the first material is spaced apart from the first substrate, and wherein a width of the first material proximal the first substrate is smaller than a width of the first material proximal the second substrate.

18. The semiconductor package of claim 17, wherein the first material comprises a material selected from the group consisting of epoxy, polymer, flux, and any combination thereof.

19. The semiconductor package of claim 17, further comprising a die disposed over the first substrate, wherein the first substrate is arranged between the die and the first plurality of electrical features.

20. The semiconductor package of claim 17, wherein immediately adjacent ones of the first material are laterally separated from each other.

* * * * *